United States Patent [19]

Shin et al.

[11] Patent Number: 4,961,015

[45] Date of Patent: Oct. 2, 1990

[54] MOS CURRENT SWITCHING CIRCUIT

[75] Inventors: Yasuhiro Shin; Kazuo Kobayashi, both of Tokyo, Japan

[73] Assignee: Oki Electric Industry Co., Ltd., Tokyo, Japan

[21] Appl. No.: 319,216

[22] Filed: Mar. 3, 1989

[30] Foreign Application Priority Data

Mar. 7, 1988 [JP] Japan .................................. 63-52912

[51] Int. Cl.$^5$ ..................... H03K 17/687; H03K 3/01; H03K 17/16
[52] U.S. Cl. ................................... 307/572; 307/571; 307/576; 307/585; 307/270; 307/443
[58] Field of Search ............... 307/571, 572, 573, 575, 307/576, 583, 584, 585, 270, 443

[56] References Cited

U.S. PATENT DOCUMENTS

4,763,028 8/1988 Henry .................................. 307/572

Primary Examiner—Stanley D. Miller
Assistant Examiner—Trong Quang Phan
Attorney, Agent, or Firm—Flynn, Thiel, Boutell & Tanis

[57] ABSTRACT

A MOS current switching circuit comprises a first MOSFET, a second MOSFET, a first control circuit, a second control circuit, and an inverting amplifier. The inverting amplifier receives an output voltage of a current source to provide a feedback bias voltage to the first and second control circuit which are controlled by a control signal. The first and second control circuits are complementary operated to each other in response to the control signal to provide the feedback bias voltage to the gate electrode of the first or second MOSFET. The first or second MOSFET passes selectively a noiseless constant current from the current source toward the output terminal.

9 Claims, 7 Drawing Sheets

MOS CURRENT SWITCHING CIRCUIT

BACKGROUND OF THE INVENTION

1. Field of the Invention

This invention relates to a MOS current switching circuit comprising a plurality of MOS field effect transistors (FETs), particularly to a current switching circuit to be used for switching an analog current with high precision in a monolithic integrated circuit (hereafter referred to monolithic IC) of complementary MOS transistors (hereafter referred to as CMOS) and the like.

2. Description of the Related Art

A prior art current switching circuit has been disclosed in Japanese Patent Laid-Open Publication Nos. 56-107638 and 59-186420.

An arrangement of the prior art CMOS current switching IC is described with reference to FIG. 4.

The arrangement of the current switching circuit comprises a first power supply voltage Vdd, a second power voltage supply Vss; a switching circuit 20 composed of a NAND gate 25 comprising P-channel FETs 25a, 25b and N-channel FETs 25c, 25d, power supply terminals 26, 27 for receiving voltage from the first and second power supply voltages Vdd and Vss, an input current terminal 21 for receiving current from a current source 10 (described later), an output current terminal 23 for supplying the current, and a control terminal 22 for receiving a control signal from a control signal generator (not shown); the current source 10 is composed of a p-channel FET 10a and connected to the power supply voltage Vdd and the input terminal 21. To the gate of the p-channel FET 10a is applied a bias voltage by a bias voltage terminal Vb.

With the arrangement set forth above, an output current from the current source 10 can be supplied or not supplied via the input current terminal 21 to the output current terminal 23 in response to a control signal in high level (hereafter referred to as H level control signal) or in a low level (hereafter referred to as L level control signal). Provided that the H level control signal is applied to the control terminal 22, the current is supplied from the input current terminal 21 to a gate electrode of the FET 24 whereby the NAND gate 25 operates as an inverting amplifier having an input terminal thereof at the side of the input current terminal 21 and an output terminal thereof. As a result, the FET 24 is conductive since a feedback bias signal from the NAND gate 25 is applied to the gate electrode of the FET 24 whereby the FET 24 is feedback biased and an output current is supplied from the output terminal 23. On the contrary, provided that the control signal is L level at the control terminal 22, the output signal of the NAND gate 25 becomes H level to render the FET 24 to be non-conductive, hence no current is supplied to the output terminal 23.

Figure 6:
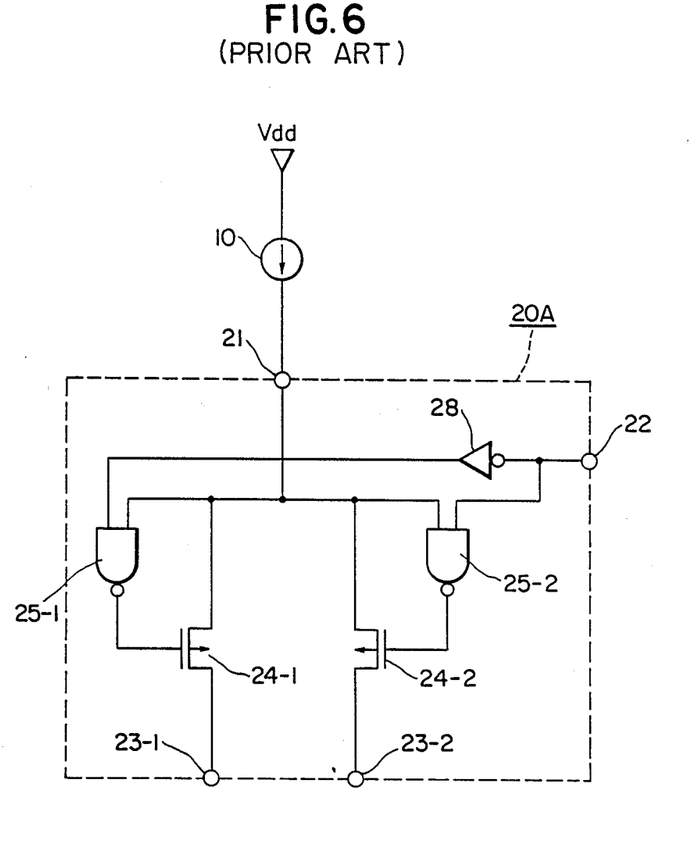
FIG. 6 is a view showing a second prior art current switching circuit.
Figure 7:
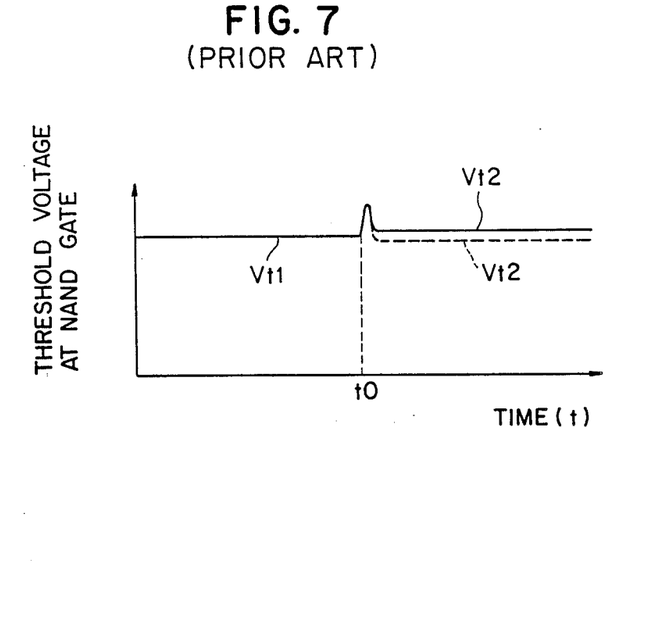
FIG. 7 is a view showing the waveform of a threshold voltage of a NAND gate employed in the prior art current switching circuit.

FIG. 6 shows an arrangement of another prior art current switching circuit for providing complementary output currents.

The arrangement of the current switching circuit 20A comprises an input current terminal 21 for receiving a current from a current source 10, a P-channel FET 24-1, a NAND gate 25-1 which are connected with each other in series between the input current terminal 21 and an output current terminal 23-1, a P-channel FET 24-2, a NAND gate 25-2 which are connected with each other in series between the input current terminal 21 and an output current terminal 23-2, a control terminal 22 for receiving a control signal from a control signal generator (not shown) and supplying the control signal to an inverter 28 and the NAND gate 25-2, the inverter 28 for inverting the control signal received from the control terminal 22 and supplying the inverted control signal to the NAND gate 25-1. The NAND gates 25-1, 25-2 provides complementary output H level and L level voltage to permit the FETs 24-2, 24-1 to be in complementary conductive or nonconductive state. As a result, output current is supplied from one of the output current terminals 23-1 or 23-2.

Figure 4:
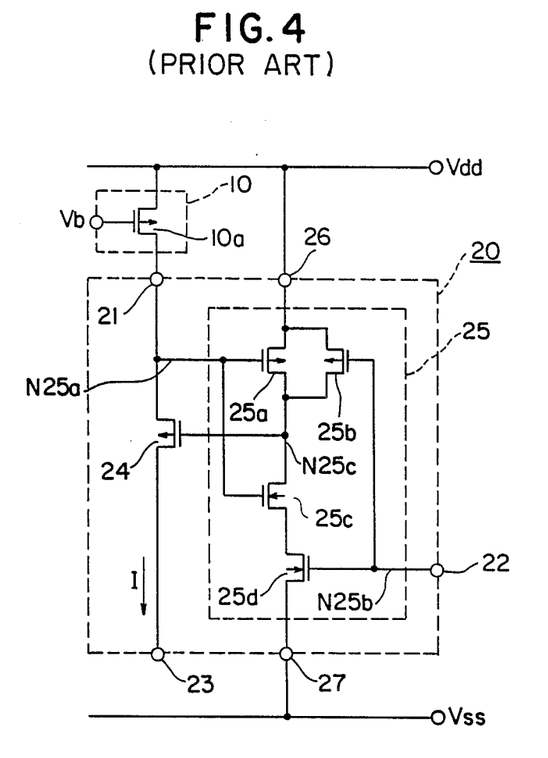
FIG. 4 is a view showing a first prior art current switching circuit.

The prior art current switching circuits as illustrated in FIGS. 4 and 6 have features in that firstly an output impedance of the current supplied from the output current terminals 23, 23-1, 23-2 is high, secondly, the arrangement of these current switching circuits are adapted for the monolithic IC, and thirdly, a bias voltage for switching is unnecessitated to be supplied from the outside.

However, there are following problems in the prior art current switching circuit.

(1) One NAND gate 25 has a switching function as well as an inverting amplification function. However, due to characteristic of the NAND gate 25, an input threshold voltage Vt is varied at the time of switching operation (transition operation), hence the output current is likely to be varied.

Figure 5A:
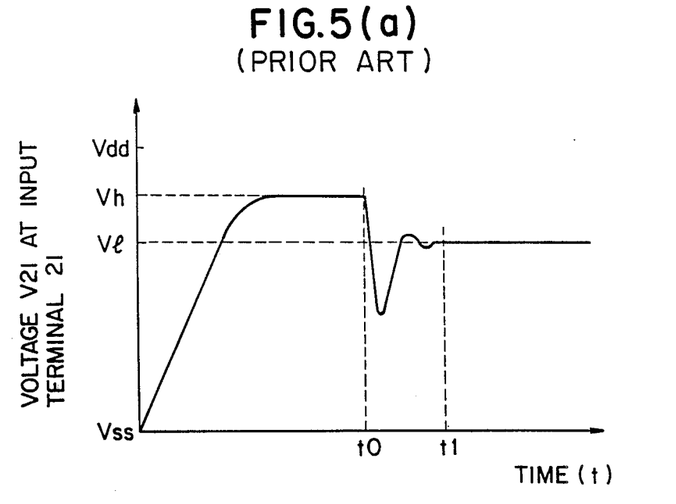
FIGS. 5(a) and 5(b) respectively showing waveforms of output voltage and current of prior art circuits.
Figure 5B:
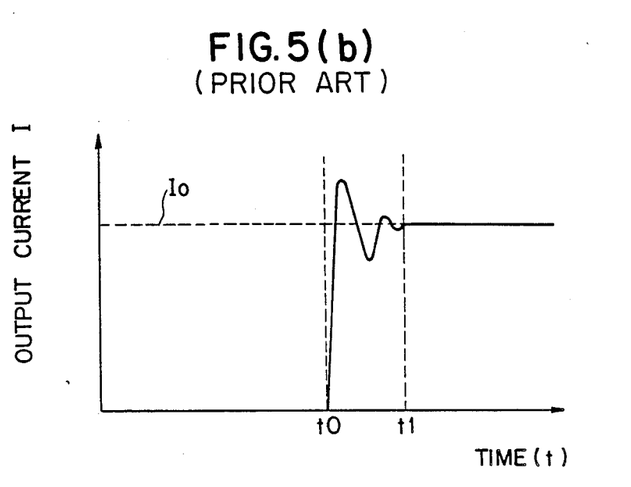

More in detail, when the FET 24 as a curent switch is switched to be conductive or nonconductive, the NAND gate 25 having an inverting amplification function and providing the feedback bias voltage is switched from a conductive state to a nonconductive state or from the nonconductive state to the conductive state so that the input current terminal 21 connected to the input side of the NAND gate 25 is varied at the time when the FET 24 is switched to the conductive state or the nonconductive state whereby a noise is produced in the output current supplied from the output current terminal 23. That is, when the control signal applied to the control terminal 22 is switched from L level to H level, the voltage at the input side of the NAND gate, namely at the side of the input current terminal 21 is switched to the H level from the L level and the FET 24 is switched to the nonconductive state from the conductive state. At this time, there appeared a period when a threshold voltage at the output side of the NAND gate 25 is higher than that of a normal state until the threshold voltage at the output side of the NAND gate 25 reaches the threshold voltage at the normal state. As a result, the threshold voltage at the output side of the NAND gate 25 is higher than that of a normal state so that the voltage at the side of the gate electrode of the FET 24 is lower than that of the normal state. Due to the threshold voltage being lower than that of the normal state, a resistance between the source and the drain of the P-channel FET 24 is lower than that of the normal state. At that period, a current value supplied from the current source is greater than the predetermined current value. Accordingly, as shown in FIG. 5 (b) representing a current wave, the noise is produced at a leading edge so that a value of output current is varied, which results in a settling time for stabilizing the output current.

(2) According to the arrangement of the current switching circuit in FIG. 6, as same as in the arrangement of the prior art current switching circuit as shown in FIG. 4, when the control signal from the control terminal 22 is switched to the H level from the L level, the input terminal of the NAND gate 25-2 at the side of control terminal 22 is switched to the H level from the L level while the input terminal of the NAND gate 25-1 is switched to the L level from the H level whereby the FET 24-1 is switched to the nonconductive state from the conductive state while the FET 24-2 is switched to the conductive state from the nonconductive state. At this period, the noise is produced at the leading edge of the output current supplied from the output terminal 23-2 as illustrated in FIG. 5(b) whereby the output current is varied.

The NAND gates 25-1, 25-2 employed in the prior art current switching circuit in FIG. 6 provides complementary output signals. Namely, two NAND gates 25-1, 1, 25-2 are employed to provide the complementary output signals. However, it is difficult to permit the threshold voltage Vt of the NAND gates 25-1, 25-2 to be completely in the same level due to variations produced in manufacturing the NAND gates such as improper masking, variation of dispersion of impurity, and variation of thickness of oxide film. As a result, the NAND gates 25-1, 1, 25-2 have normally different characteristics whereby everytime the FETs 24-1, 24-2 are switched to conductive state or nonconductive state, the current value is varied. As a result, it is impossible to obtain complementary output currents of the same value.

SUMMARY OF THE INVENTION

It is an object of the present invention to provide a MOS current switching circuit which can reduce output current variation and settling time at switching operation.

It is another object of the present invention to provide a MOS current switching circuit which to provides complementary output currents of the same value.

To achieve the above objects, the MOS current switching circuit of the present invention having a first MOSFET and a second MOSFET to be switched alternately to be in conductive or nonconductive state by receiving a feedback bias voltage from an inverting amplifier is characterized in that a single inverting amplifier is provided for inverting and amplifying voltage supplied via a current source to thereby provide the feedback bias voltage which is applied to a gate electrode of a first MOSFET or a gate electrode of a second MOSFET via a first control circuit or a second control circuit for switching and supplying the output current from the current source via a drain and a source of the first MOSFET or a drain and a source of the second MOSFET to an output current terminal on the basis of complementary control signals.

The above and other objects, features and advantages of the present invention will become more apparent from accompanying drawings.

DESCRIPTION OF THE PREFERRED EMBODIMENT

Figure 1:
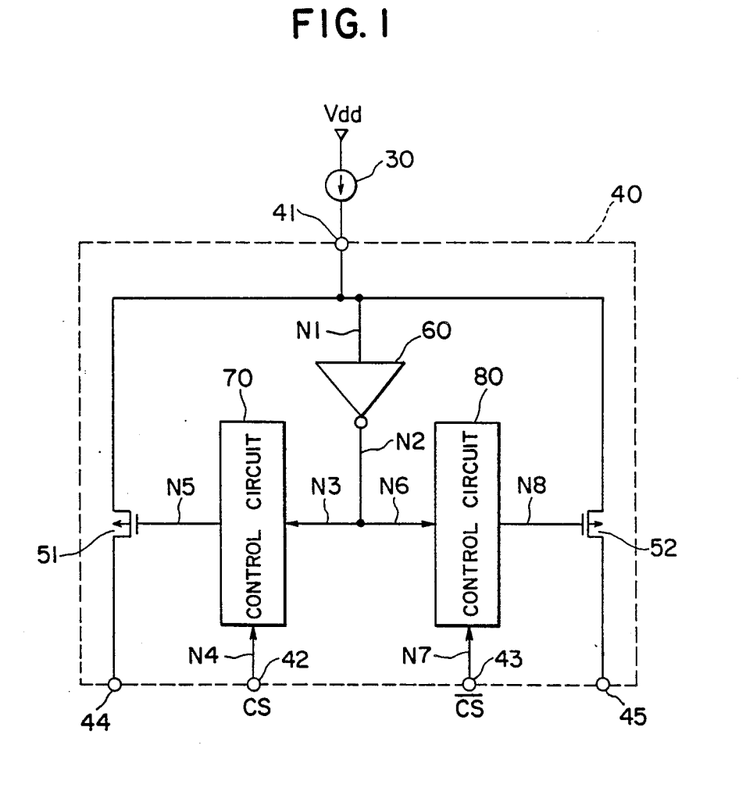
FIG. 1 is a view showing a MOS current switching circuit according to a first embodiment of the present invention.

An arrangement of a current switching circuit of a first embodiment of the present invention will be described with reference to FIG. 1.

The current switching circuit 40 comprises an input current terminal 41 connected to a current source 30 for receiving an output current from the current source 30, control terminals 42, 43 for receiving complementary control signals CS, $\overline{CS}$, output terminals 44, 45 for supplying complementary output currents, a first P-channel MOSFET 51 having a source connected to the input current terminal 41 and a drain connected to the output current terminal 44, a second P-channel MOSFET 52 having a source connected to the input current terminal 41 and a drain connected to the output current terminal 45, an inverting amplifier 60 connected to the input current terminal 41 via a node N1 for amplifying the voltage received from the current source via the input current terminal 41, providing a feedback bias voltage to a first control circuit 70 via a node N3, and to a gate electrode of the first FET 51 via a node N5, or supplying the feedback bias voltage to a second control circuit 70 via a node N6, and a gate electrode of the second FET 52 via a node N8.

The first control circuit 70 is a switching circuit for turning on or off between the nodes N3 and N5 on the basis of the control signal CS received from the control terminal 42 via a node N4 and cuts off by supplying the feedback bias voltage to the gate of the MOSFET 51 while the second control circuit 80 is a switching circuit for turning on or off between the nodes N6 and N8 on the basis of the complementary control signal $\overline{CS}$ received from the control terminal 43 via a node N7 and cuts off by supplying the feedback bias voltage to the gate of the MOSFET 52.

With the arrangement of the current switching circuit of the first embodiment of the present invention, when the control signal CS and the inverted control signal $\overline{CS}$ are supplied to the control terminals 42, 43, the feedback bias voltage from the inverting amplifier 60 are supplied to the gate electrodes of the FETs 51, 52 via the control circuits 70, 80 whereby one of the FETs 51, 52 is in the conductive state. The FET 52 or 51 which does not receive the feedback bias voltage is cut off by the control circuit 80 or 70 so that the output current from the current source 30 is prevented from supplying to the output current terminal 45 or 44. That is, according to the current switching circuit 40, one of the FETs 51, 52 is in conductive state and the other is in nonconductive state for thereby allowing complementary output currents to be supplied from the output current terminals 44, 45.

Figure 2:
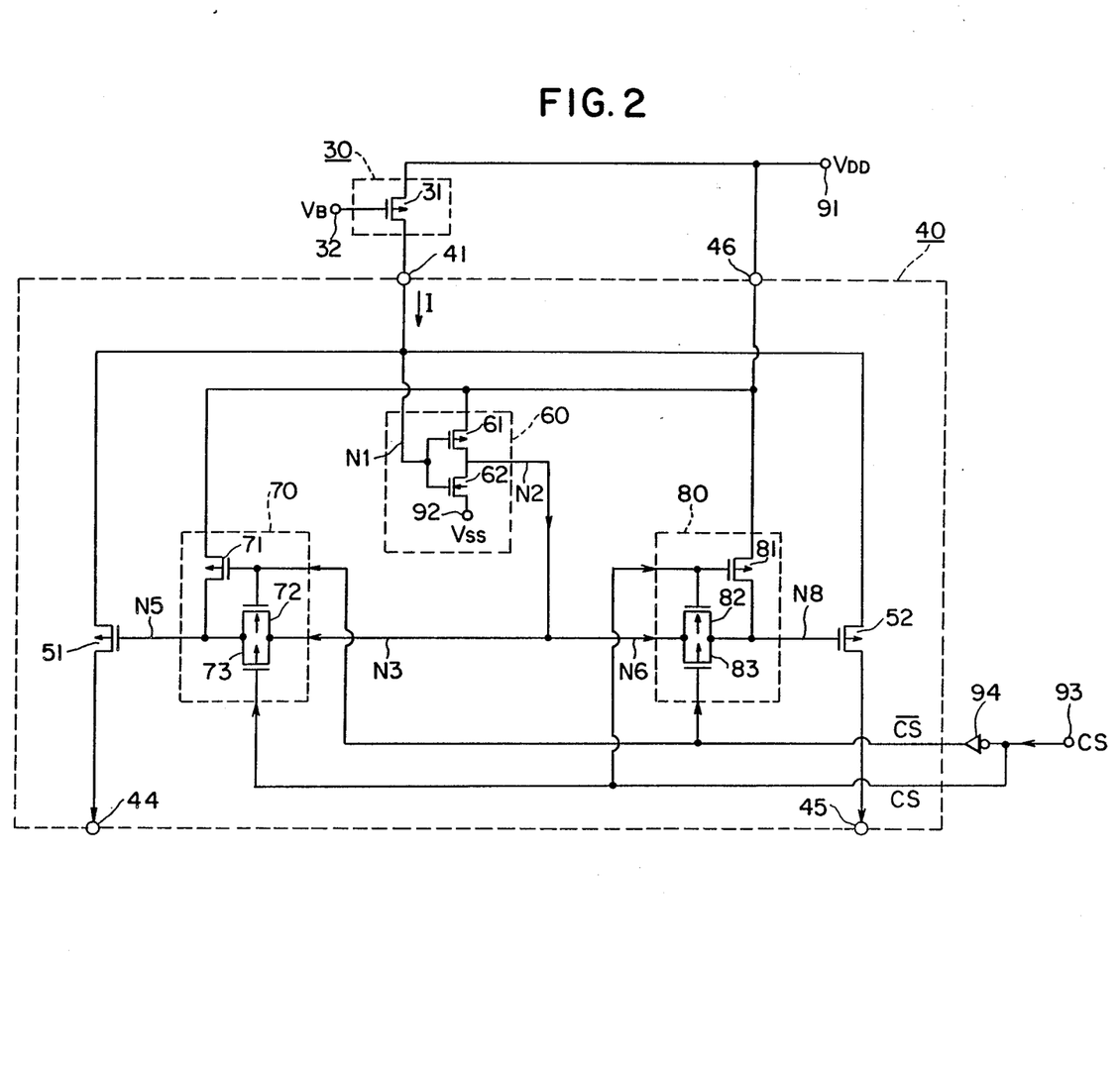
FIG. 2 is a view showing a MOS current switching circuit according to a second embodiment of the present invention.
Figure 3:
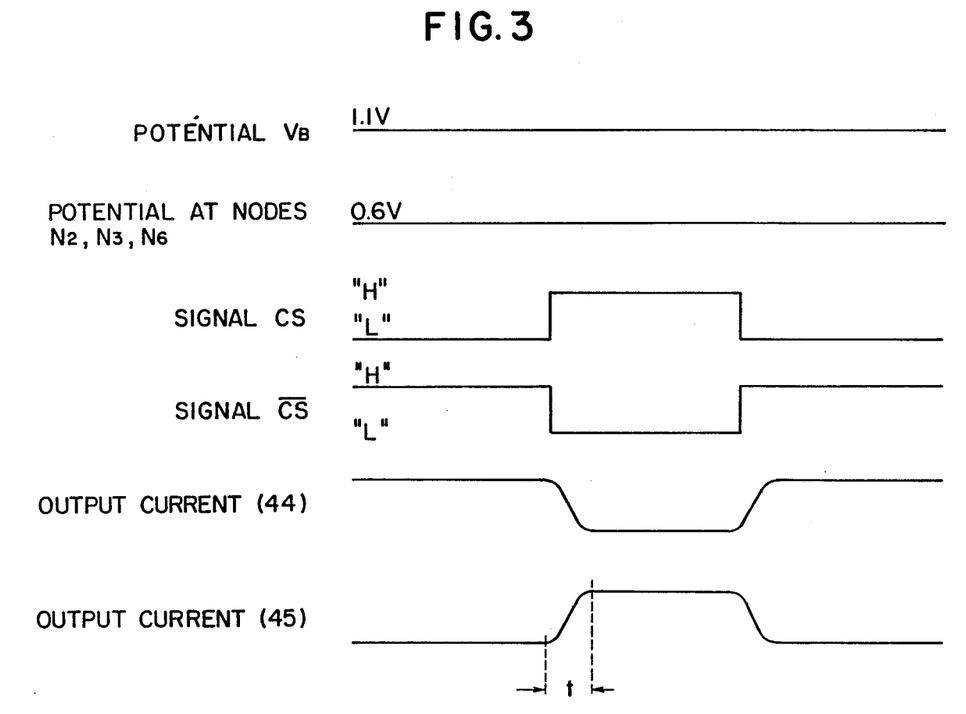
FIG. 3 is a time chart showing signals provided by the current switching circuit according to the first and the second MOS current switching circuit.

The current switching circuit according to a second embodiment of the present invention will be described with reference to FIG. 2.

The current switching circuit 40 comprises first and second power supply voltage terminals 91, 92, a control terminal 93 for receiving a control signal from a control signal generator (not shown), an inverter 94 connected to the control terminal 93 for inverting the control signal received from the control terminal 93, a current source 30 composed of p-channel FET 31 and connected to the first power supply voltage terminal 91, a power supply voltage terminal 6, an inverting amplifier 60 composed of P-channel FET 61 and N-channel FET 62 connected in series between the power supply voltage terminal 46 and the second power supply terminal 92, for receiving the output current I from the current source 30, and in which the gate electrodes of the FET 61, 62 are respectively connected to a node N1 at the input side, and a first control circuit 70 composed of a p-channel FET 71 connected between the power supply voltage terminal 46 and a node N5 at the output side, and an analog switch composed of an N-channel FET 72 and a P-channel FET 73 connected in parallel between a node N3 at the input side and the node N5 at the output side, a gate electrode of the N-channel FET 72 is connected to a gate electrode of the FET 71 and the output side of the inverter 94 while a gate electrode of the FET 73 is connected to the control terminal 93. A second control circuit 80 is composed of a p-channel FET 81 connected between the power supply terminal 46 and a node N8 at the output side, and an analog switch including an and an N-channel FET 82 and a P-channel FET 83 connected in parallel between a node N6 at the input side and the node N8 at the output side, in which a gate electrode of the N-channel FET 82 is connected to a gate electrode of the FET 81 and the control terminal 93 while a gate electrode of the FET 83 is connected to the output side of the inverter 94.

An operation of the current switching circuit according to the second embodiment of the present invention will be described herewith.

In the case that the control signal applied to the control terminal 93 is H level, the control circuit 70 composed of the FETs 72, 73 which form the analog switch is in the nonconductive state so that the node N5 at the output side thereof is controlled by the FET 71 to be in the H level and the MOSFET 51 is in the cutoff state. On the other hand, at this time the control circuit 80 composed of FETs 82, 83 which form the analog switch is in the conductive state to thereby permit the portion between the node N6 and the node N8 to be in conductive state whereby the MOSFET 52 receives the feedback bias voltage from the inverting amplifier 60 and the output current from the current source 30 is supplied to the output terminal 45 via the MOSFET 52.

In the case that the control signal applied to the control terminal 93 is L level, the control circuit 70 forming the analog switch and composed of the FETs 72, 73 is in the conductive state to thereby allowing the portion between the nodes N3, N5 to be in the conductive state so that the FET 51 receives the feedback bias voltage from the inverting amplifier 60 and the output current from the current source 30 is supplied to the output terminal 44 via the FET 51. On the other hand, at this time, the control circuit 80 forming the analog switch and composed of the FETs 82, 83 is in the nonconductive state to thereby allow the node N8 to be in the H level by the FET 81 whereby the FET 52 is in the cutoff state. Accordingly, with the arrangement of the current switching circuit according to the second embodiment of the present invention, it is possible to supply the output current of the current source 30 to the first and second output terminals 44, 45.

There are following advantages obtained by the current switching circuit of the first and second embodiments of the present invention.

(a) Compared with the prior art current switching circuit in which the inverting amplifier is turned on or turned off which results in variation of input and output characteristic of the inverting amplifier at the time of switching of the output of the inverting amplifier, at the time of switching the control signal to be applied to the control terminal 42, 43, 93, the inverting amplifier 60 for providing the feedback bias voltage is to be switched by the control circuits 70, 80 for thereby reducing the noise produced in the output current as well as reducing the settling time of the output current.

(b) With the arrangement of the prior art current switching circuit as shown in FIG. 6, in as much as two inverting amplifiers, namely two NAND gates are necessitated at the inverting amplifier to provide the feedback bias voltage for supplying the complementary output currents, the complementary output currents to be supplied from the output terminal are differentiated due to the characteristics of the two inverting amplifiers However, according to the current switching circuit 40 of the present invention, there is provided only the single inverting amplifier 60 for providing the feedback bias voltage for supplying the complementary output currents to the output terminals with more accuracy compared with the prior art circuit having two inverting amplifiers.

In as much as the complementary output currents can be supplied to the output terminals 44, 45, the sum of the output currents to be supplied to the output terminals 44, 45 is always constant to thereby improve the stabilization of the current source 30.

Although the invention has been described in its preferred embodiment, the present invention is not limited to the preferred embodiment but can be modified variously without departing from the scope thereof.

For example, there are the following modifications.
(i) The current source 30 of the current switching circuit of the second embodiment can be structured by other circuits.
(ii) The P-channel FETs 51, 52 can be replaced by N-channel FETs.
(iii) The inverting amplifier 60 can be structured by only N-channel FETs of by only P-channel FETs.
(iv) The control circuits 70, 80 can be structured by only N-channel FETs or by only P-channel FETs.

What is claimed is:
1. A MOS current switching circuit comprising:
an input current terminal connected to a current source for receiving a constant current therefrom, said current source being connected to a first power supply voltage;
a pair of output current terminals for supplying an output current;
a first main MOSFET having a gate electrode, a first electrode connected to said input current terminal and a second electrode connected to one of said output current terminal;
a second main MOSFET having a gate electrode, a first electrode connected to said input current terminal and a second electrode connected to the other of said output current terminals;
an inverting amplifier connected to the input current terminal for providing a feedback bias voltage signal, said inverting amplifier being connected between said first power supply voltage and a second power supply voltage to thereby receive a power supply;

means for providing first and second control signal each having first and second logic levels such that said first control signal is at the first logic level while said second control signal is at the second logic level and said first control signal is at the second logic level while said second control signal is at the first logic level;

a first control circuit having a first control MOSFET and a first switching element;

said first control MOSFET having a gate electrode connected to one of said control signals, a first electrode connected to the first power supply voltage, and a second electrode connected to said gate electrode of said first main MOSFET;

said first switching element having a control electrode connected to one of said control signals, said first control MOSFET being turned on while said first switching element is turned off, and said first control MOSFET being turned off while said first switching element is turned on, said first switching element also including a first electrode connected to said inverting amplifier for carrying the feedback bias voltage signal, and a second electrode selectively connectable to said first electrode and connected to said gate electrode of said first main MOSFET for supplying the feedback bias voltage signal from said inverting amplifier to said gate electrode;

a second control circuit having a second control MOSFET and a second switching element;

said second control MOSFET having a gate electrode connected to one of said control signals, a first electrode connected to the first power supply voltage, and a second electrode connected to said gate electrode of said second main MOSFET;

said second switching element a control electrode connected to one of said control signals, said second control MOSFET being turned on while said second switching element is turned off, and said second control MOSFET being turned off while said second switching element is turned on, said second switching element also including a first electrode connected to said inverting amplifier for carrying the feedback bias voltage signal, and a second electrode selectively connectable to said first electrode and connected to said gate electrode of said second main MOSFET for supplying the feedback bias voltage signal from said inverting amplifier to said gate electrode, such that said first and second main MOSFETs are both biased by the same feedback bias voltage signal.

2. A MOS current switching circuit according to claim 1, wherein said first and second switching elements each include a MOSFET.

3. A MOS current switching circuit according to claim 1, wherein said first and second switching elements each include an analog switch.

4. A MOS current switching circuit according to claim 1, wherein said first power supply voltage is positive relative to said second power supply voltage.

5. A MOS current switching circuit according to claim 1, wherein each of said first main MOSFET, second main MOSFET, first control MOSFET, and second control MOSFET, is a P-channel MOSFET.

6. A MOS current switching circuit comprising: current source means for supplying electric current;

a pair of current output terminals;

a first MOSFET having a gate terminal, a first terminal connected to said curent source means and a second terminal connected to one of said current output terminals;

a second MOSFET having a gate terminal, a first terminal connected to said current source means and a second terminal connected to the other of said current output terminals;

means for selectively biasing both of said first and second MOSFETs with the same bias voltage signal, including an inverting amplifier having input and output terminals, said inverting amplifier being connected at said input terminal thereof to said current source means for providing a bias voltage signal at said output terminal thereof;

control means for carrying a control signal;

a first control circuit having a first input terminal connected to said control means, a second input terminal connected to said output terminal of said inverting amplifier, and an output terminal which is selectively connectable to said second input terminal and is connected to said gate terminal of said first MOSFET for selectively supplying the bias voltage signal from said inverting amplifier output terminal to said gate terminal;

a second control circuit having a first input terminal connected to said control means, a second input terminal connected to said output terminal of said inverting amplifier and to said second input terminal of said first control circuit, and an output terminal which is selectively connectable to said second input terminal thereof and is connected to said gate terminal of said second MOSFET for selectively supplying the bias voltage signal from said inverting amplifier output terminal to said gate terminal; and said first and second control circuits each including switch means responsive to said control signal for selectively connecting the associated said second input terminal to the associated said output terminal to selectively apply the bias voltage signal to said gate terminal of the associated said MOSFET.

7. A MOS current switching circuit according to claim 6, wherein said current source means includes a voltage source which is connected to said first control circuit, said second control circuit, and said inverting amplifier.

8. A MOS current switching circuit according to claim 7, wherein said first control circuit includes a third input terminal connected to said voltage source, and a P-channel FET connected between the third input terminal and the output terminal thereof, said switch means of said first control circuit including an analog switch having an N-channel FET and a P-channel FET which each have a gate terminal and a pair of further terminals, each said FET of said analog switch having said further terminals thereof connected respectively to said further terminals of the other said FET such that said FETs are connected in parallel with each other between said second input terminal and said output terminal of said first control circuit.

9. A MOS current switching circuit according to claim 7, wherein said second control circuit includes a third input terminal connected to said voltage source, and a P-channel FET connected between said third input terminal and said output terminal thereof, said switch means of said second control circuit including an analog switch having an N-channel FET and a P-channel FET which each have a gate terminal and a pair of further terminals, each said FET of said analog switch having said further terminals thereof connected respectively to said further terminals of the other said FET such that said FETs are connected in parallel with each other between said second input terminal and said output terminal of said second control circuit.

* * * * *

UNITED STATES PATENT AND TRADEMARK OFFICE
CERTIFICATE OF CORRECTION

PATENT NO. : 4 961 015

DATED : October 2, 1990

INVENTOR(S) : Yasuhiro SHIN et al

It is certified that error appears in the above-identified patent and that said Letters Patent is hereby corrected as shown below:

Column 7, line 38; after "element" insert ---having---.

Signed and Sealed this

Fourth Day of August, 1992

Attest:

DOUGLAS B. COMER

*Attesting Officer*  *Acting Commissioner of Patents and Trademarks*